United States Patent
Katayama et al.

(10) Patent No.: US 6,420,731 B1
(45) Date of Patent: Jul. 16, 2002

(54) LIGHT EMITTING DIODE AND MANUFACTURING METHOD THEREOF

(75) Inventors: Koji Katayama; Hideki Matsubara; Akihiko Saegusa, all of Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/603,855

(22) Filed: Jun. 26, 2000

(30) Foreign Application Priority Data

Jul. 1, 1999 (JP) .......................................... 11-187604

(51) Int. Cl.[7] .............................................. H01L 27/15
(52) U.S. Cl. .............................. 257/79; 257/17; 257/94; 257/91
(58) Field of Search ........................... 257/14, 190, 96, 257/91; 357/17; 372/46, 96

(56) References Cited

U.S. PATENT DOCUMENTS

| | | | | |
|---|---|---|---|---|
| 4,992,837 A | * | 2/1991 | Sakai et al. | 357/17 |
| 5,319,219 A | * | 6/1994 | Cheng et al. | 257/14 |
| 5,544,190 A | * | 8/1996 | Mensz | 372/46 |
| 5,838,029 A | * | 11/1998 | Shakuda | 257/190 |
| 5,909,459 A | * | 6/1999 | Ishibashi et al. | 372/96 |
| 6,072,819 A | * | 6/2000 | Shakuda | 372/46 |
| 6,121,635 A | * | 9/2000 | Watanabe et al. | 257/91 |
| 6,242,761 B1 | * | 6/2001 | Fujimoto et al. | 257/94 |
| 6,268,230 B1 | * | 7/2001 | Kuniyasu | 438/46 |

FOREIGN PATENT DOCUMENTS

| JP | 05-166923 | 7/1993 |
|---|---|---|
| JP | 5-59861 | 8/1993 |
| JP | 05-315646 | 11/1993 |

OTHER PUBLICATIONS

"Degradation of II–VI based blue–green light emitters", S. Guha et al., Appl. Phys. Lett., vol. 63, No. 23, Dec. 1993, pp. 3107–3109.

"<100> dark line defect in II–VI blue–green light emitters", S. Guha et al., Appl. Phys. Lett., vol. 65, No. 7, Aug., 1994, pp. 801–803.

"High–Efficiency ZnCdSe/ZnMgSSe Green Light–Emitting Diodes", Norikazu Nakayama et al., Optical Review, vol. 2, No. 3, 1995, pp. 167–170.

* cited by examiner

*Primary Examiner*—David Nelms
*Assistant Examiner*—Thinh Nguyen
(74) *Attorney, Agent, or Firm*—W. F. Fasse; W. G. Fasse

(57) ABSTRACT

An injected current restriction region for restricting an increase in defects by restricting an injected current for light emission is provided inside a ZnSe-based LED. When an end of a light transmitting Au electrode is separated from a cleavage plane, a region near the cleavage plane serves as the injected current restriction region.

14 Claims, 13 Drawing Sheets

LIGHT EMITTING DIODE AND MANUFACTURING METHOD THEREOF

BACKGROUND OF THE INVENTION

1. Field of the Invention

The present invention relates to light emitting diodes and manufacturing methods thereof. More specifically, the present invention relates to a homoepitaxial ZnSe-based light emitting diode (hereinafter, referred to as an LED) which has a ZnSe single crystal substrate and a light emitting structure including a mixed crystal compound semiconductor made of ZnSe or mainly of ZnSe, as well as a manufacturing method thereof.

2. Description of the Background Art

ZnSe-based LEDs emitting green light are well known. The LED has a light emitting structure formed on a ZnSe substrate and an electrode formed thereon.

The LED is formed by depositing various semiconductor layers on the ZnSe substrate such as by epitaxial growth, forming an electrode thereon, cutting them into a chip of a prescribed size, and then fixing it to a lead frame.

However, defects such as dislocations and cracks, which are caused during cleavage, densely exist near the cleavage plane of the LED after being cut. If a current is passed through such a region having a large number of defects, not only is the light emission efficiency decreased but the density of defects increase as a consequence of the current injection resulting in short life of the element.

It can be considered that the defects near the cleavage plane can be addressed by etching and removing a portion near the cleavage plane. In this case, however, it is necessary to cope with a side etching phenomenon which is caused by a difference in the etching rates of the semiconductor layers.

SUMMARY OF THE INVENTION

The present invention was made to solve the above described problems. An object of the present invention is to provide a higher luminance value and a longer life for an LED without using complex processes.

A light emitting diode according to the present invention includes a ZnSe substrate and a light emitting structure formed on the substrate. It is noted herein that the light emitting structure refers to a stacked structure of semiconductor layers including a light emitting layer. The light emitting diode having the above described structure includes a current restriction region for suppressing the increase in the density of defects by restricting the path of the injected current for light emission.

By thus providing the injected current restriction region, it is possible to restrict or prevent a current flow into the region and to suppress the increase in the defect density in the region. Especially by selecting a region having a large number of defects as the injected current restriction region, it is possible to realize a longer life and a higher luminance value for the LED.

Preferably, the above described light emitting diode is a homoepitaxial ZnSe-based light emitting diode. Preferably, the ZnSe substrate is a conductive ZnSe single crystal substrate, and the light emitting structure includes a mixed crystal compound semiconductor made of ZnSe or mainly of ZnSe.

The present invention is particularly effective for the homoepitaxial ZnSe-based light emitting diode as described above.

Preferably, the light emitting diode includes a cleavage plane for cutting an element to be separated. At this time, the injected current restriction region preferably includes a region near the cleavage plane.

As described above, a large number of defects may exist near the cleavage plane of a light emitting diode. Therefore, by suppressing a current flow into such a region having a large number of defects, it is possible to realize a longer life and a higher luminance value for the LED.

The light emitting diode has an ohmic electrode (also called the "second electrode" herein) on the light emitting structure. Preferably, th e ohmic electrode or second electrode is positioned to be apart from the above described cleavage plane.

By providing the ohmic electrode to be apart from the cleavage plane, it is possible to suppress a current flow into the vicinity of the cleavage plane.

It is therefore possible to realize a longer life and a higher luminance value for the LED. Since the position of an end of the electrode only needs to be adjusted, the LED can be given a longer life and a higher luminance value without complex processes.

Specifically, the above described second or ohmic electrode is formed to be isolated from the cleavage plane by at least 5 $\mu$m, and the diode has a further first electrode for wire bonding.

Since a particularly large number of defects may exist in a region within 5 $\mu$m from the cleavage plane, the longer life of the LED can be effectively provided by not forming the ohmic electrode for diffusing an injected current at least in this designated region.

Preferably, the above described second or ohmic electrode is a light transmitting electrode and includes at least one material selected from the group consisting of Au, Pd, Ni and ITO (Indium Tin Oxide).

The light emitting diode according to the present invention may have, on the light emitting structure, a non-ohmic first electrode made of a material not attaining ohmic contact with the light emitting structure for restricting an injected current, and an ohmic second electrode made of a material attaining ohmic contact with the light emitting structure for diffusing an injected current. It is preferred in this case that the first electrode is formed on the region near the cleavage plane and the second electrode is formed on a region other than the region near the cleavage plane.

Since the first electrode does not attain ohmic contact with the light emitting structure, a current flow from the first electrode into the light emitting structure can be suppressed. In other words, a current flow into a region under the first electrode can be suppressed. It is therefore possible to suppress an increase in defects in the region under the first electrode. By providing the first electrode on the region near the cleavage plane, for example, it is possible to prevent a current flow into the region near the cleavage plane and to suppress an increase in defects in the region. On the other hand, a current can be applied from the second electrode into the light emitting structure, causing the LED to emit light.

The light emitting diode may have a semiconductor layer selectively provided inside the light emitting structure and not attaining ohmic contact with the first electrode, and a trench portion provided at an upper surface peripheral portion of the light emitting structure and extending to the cleavage plane and the semiconductor layer. In this case, the first electrode is formed on the trench portion to be in contact with the semiconductor layer.

In this case as well, it is possible to suppress a current flow into the region under the first electrode and to suppress an increase in defects in the region under the first electrode. Preferably, the trench is formed by etching. More specifically, the trench is preferably formed by such etching that emphasizes irregularity on the trench surface, for example, ion milling and reactive ion etching.

Preferably, the above described first electrode is formed at least on a region within 5 µm from the cleavage plane and includes at least one material selected from the group consisting of Ti, Al, ZnS, $Al_2O_3$, $SiO_2$ and SiN.

By forming the first electrode on the region as described above, it is possible to prevent a current flow into the region within 5 µm from the cleavage plane.

Furthermore, a current suppression layer for suppressing a current flow may be provided inside the light emitting structure near the cleavage plane.

By thus providing the current suppression layer inside the light emitting structure, it is possible to suppress a current flow into the region under the current suppression layer. It is therefore possible to suppress an increase in defects in the region.

The light emitting diode may include a first electrode for restricting an injected current, provided on such a surface portion of the light emitting structure that is located on the above described current suppression layer and made of a material not attaining ohmic contact with the current suppression layer, and a second electrode for diffusing an injected current, provided on such a surface portion of the light emitting structure that is located on a region where the current suppression layer is not formed and made of a material attaining ohmic contact with the light emitting structure.

By thus providing the first electrode using the material not attaining ohmic contact with the current suppression layer, it is possible to suppress a current flow into the region under the current suppression layer even if a certain conductive layer exists between the first electrode and the current suppression layer. It is therefore possible to suppress the increase in the density of defects in the region under the current suppression layer.

In one aspect, a light emitting diode manufacturing method according to the present invention includes the steps of forming a light emitting structure on a ZnSe substrate; forming, on a first surface region of the light emitting structure, a first electrode made of a material not attaining ohmic contact with the light emitting structure for restricting an injected current; and forming, on a second surface region of the light emitting structure, a second electrode made of a material attaining ohmic contact with the light emitting structure for diffusing an injected current.

By thus forming the first electrode made of the material not attaining ohmic contact with the light emitting structure on the first surface region, it is possible to suppress a current flow into a region immediately under the first surface region. It is therefore possible to suppress the increase in the density of defects in the region. Since the second electrode made of the material attaining ohmic contact with the light emitting structure is formed on the second surface region different from the first surface region, a current can be supplied from the second electrode into the light emitting structure, causing the LED to emit light.

In another aspect, a light emitting diode manufacturing method according to the present invention includes the steps of: forming a light emitting structure on a ZnSe substrate by sequentially stacking a first semiconductor layer including a light emitting layer, selectively a second semiconductor layer on the first semiconductor layer, and a third semiconductor layer from the top of the semiconductor to the top of the second semiconductor layer; forming, on such a surface portion of the light emitting structure that is located on the second semiconductor layer, a first electrode made of a material not attaining ohmic contact with the second semiconductor layer for restricting an injected current; and forming, on such a surface portion of the light emitting structure that is located on a region where the second semiconductor layer is not formed, a second electrode made of a material attaining ohmic contact with the light emitting structure for diffusing an injected current. It is noted that the above described first to third semiconductor layers are a stacked structure of a plurality of semiconductor layers.

By thus selectively forming the second semiconductor layer on the first semiconductor layer and forming the first electrode thereon, it is possible to suppress a current flow into a region immediately under the semiconductor layer. It is therefore possible to suppress an increase in defects in the region under the semiconductor layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, the embodiments of the present invention will be described with reference to FIGS. 1 to 15.

As described below, an important feature of the present invention is to selectively provide an injected current restriction region for restricting an injected current for light emission. By thus providing the injected current restriction region, it is possible to suppress an increase in defects in the region and to realize a longer life and a higher luminance value for an LED.

With reference to the figures, a detailed description will be provided.

First Embodiment

Figure 1:
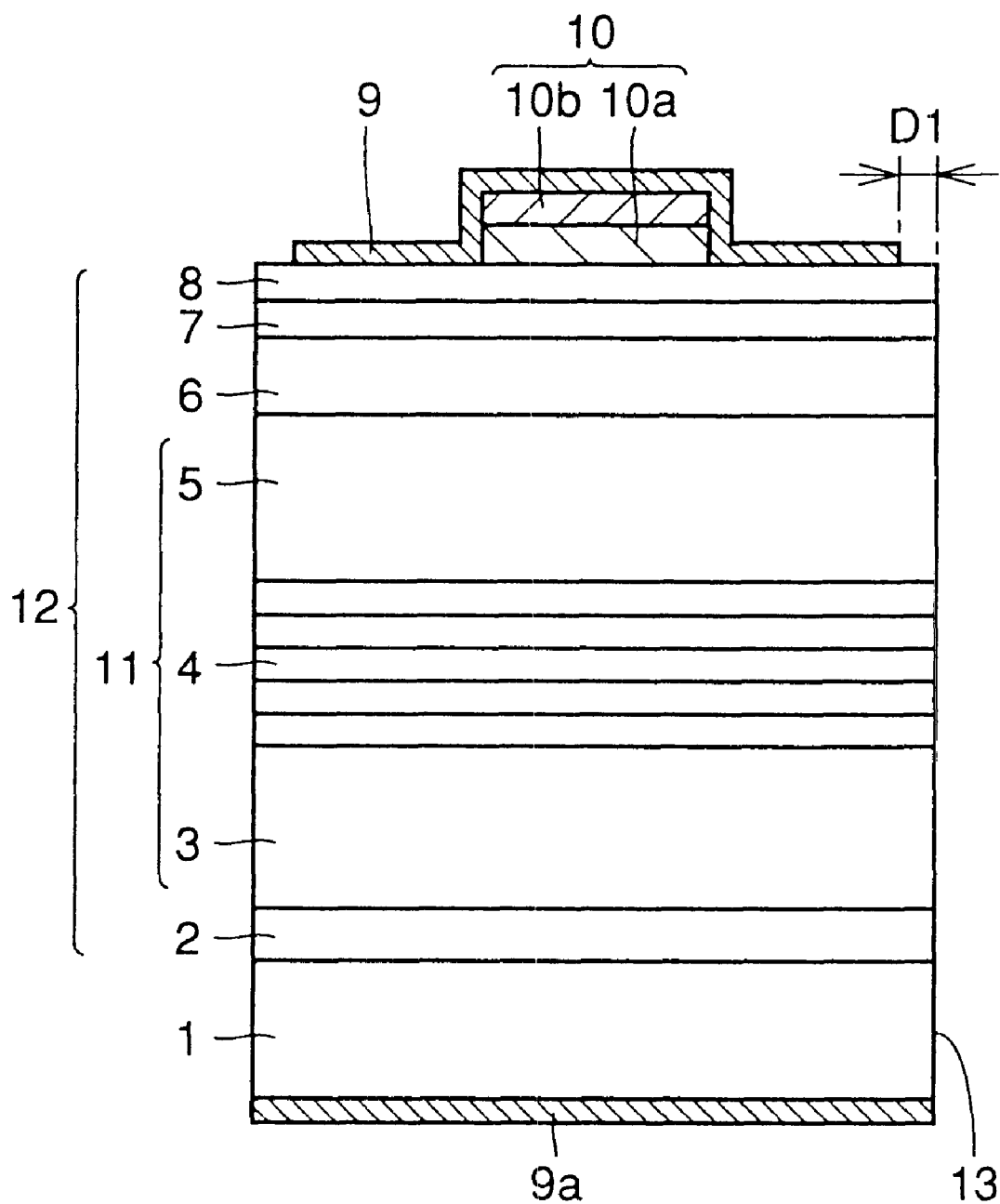
FIGS. 1 to 3 are sectional views of LEDs in first to third embodiments of the present invention.

FIG. 1 is a sectional view of an LED in a first embodiment of the present invention. As shown in FIG. 1, the LED includes a conductive ZnSe single crystal substrate 1, a light emitting structure 12 formed thereon, and a light transmitting Au second electrode 9 for diffusing an injected current for light emission, and a base electrode or first electrode 10 for wire bonding. The LED is cleaved on a cleavage plane 13 for element separation.

An In electrode 9a is formed as a third electrode 9a on the back surface of conductive ZnSe single crystal substrate 1. Light emitting structure 12 is formed on the top surface of conductive ZnSe single crystal substrate 1.

Light mitting structure 12 has an n-type ZnSe buffer layer 2 having a thickness of about 1 μm, an n-type ZnMgSSe cladding layer 3 having a thickness of about 1 μm, a ZnSe/ZnCdSe multiple quantum well active layer 4, a p-type ZnMgSSe cladding layer 5 having a thickness of about 1 μm, a p-type ZnSe layer 6 having a thickness of about 0.2 μm, a p-type contact layer 7 formed of a stacked superlattice structure of ZnSe and ZnTe, and a p-type ZnTe layer 8 having a thickness of about 60 nm on the top.

As described above, light emitting structure 12 is formed of the stacked structure of a plurality of semiconductor layers (epitaxial layers) and includes a light emitting layer 11. Light emitting layer 11 has n-type ZnMgSSe cladding layer 3, ZnSe/ZnCdSe multiple quantum well active layer 4, and p-type ZnMgSSe cladding layer 5.

Light transmitting Au second electrode 9 and first base electrode 10 are formed on the top surface of light 10a and an Au layer 10b. Light transmitting Au second electrode 9 has a thickness of 20 nm or less and is formed to be separated from cleavage plane 13 by width D1 (preferably 5 μm or more). Thus, light transmitting Au electrode 9 is not formed on a region near cleavage plane 13. It is therefore possible to suppress a current flow into the region near cleavage plane 13 and to suppress an increase in defects in the region.

In other words, the region near cleavage plane 13 is selected as the injected current restriction region in the first embodiment. Since a larger number of defects would exist in the region near cleavage plane 13 than in other regions as described above, it is considered that suppression of a current flow into the region can effectively contribute to a longer life and a higher luminance value of the LED.

When an LED was actually fabricated and measured in a constant current mode by the inventors, high luminance green light emission was obtained of which light emission intensity was as high as 3 mW when a current of 20 mA was applied. Since the current rarely flowed near cleavage plane 13, the LED life was also improved.

In first base electrode 10 used for wire bonding, the doping concentration of p-type ZnTe layer 8 is set at $1 \times 10^{19} cm^{-3}$ or less so as to attain Schottky contact between Ti layer 10a of the base-electrode and p-type ZnTe layer 8.

In the following, a manufacturing method of the LED shown in FIG. 1 will be described briefly. On the back surface of conductive ZnSe single crystal substrate 1, In third electrode 9a is formed such as by evaporation (deposition). On the top surface of conductive ZnSe single crystal substrate 1, light emitting structure 12 is formed such as by epitaxial growth. Thereafter, Ti layer 10a and Au layer 10b are sequentially stacked such as by evaporation. After they are patterned to a prescribed shape, an Au layer is formed to a thickness of about 20 nm or less such as by evaporation again. By patterning the Au layer, a portion near cleavage plane 13 is selectively removed.

Thereafter, wafer-like ZnSe single crystal substrate 1 and light emitting structure 12 are cut into a chip having a size of 300 μm for its sides. Thus, cleavage plane 13 is formed. Thereafter, conductive ZnSe single crystal substrate 1 and light emitting structure 12 are fixed to a lead frame. The LED in this embodiment is formed through the above described steps.

Second Embodiment

Figure 2:
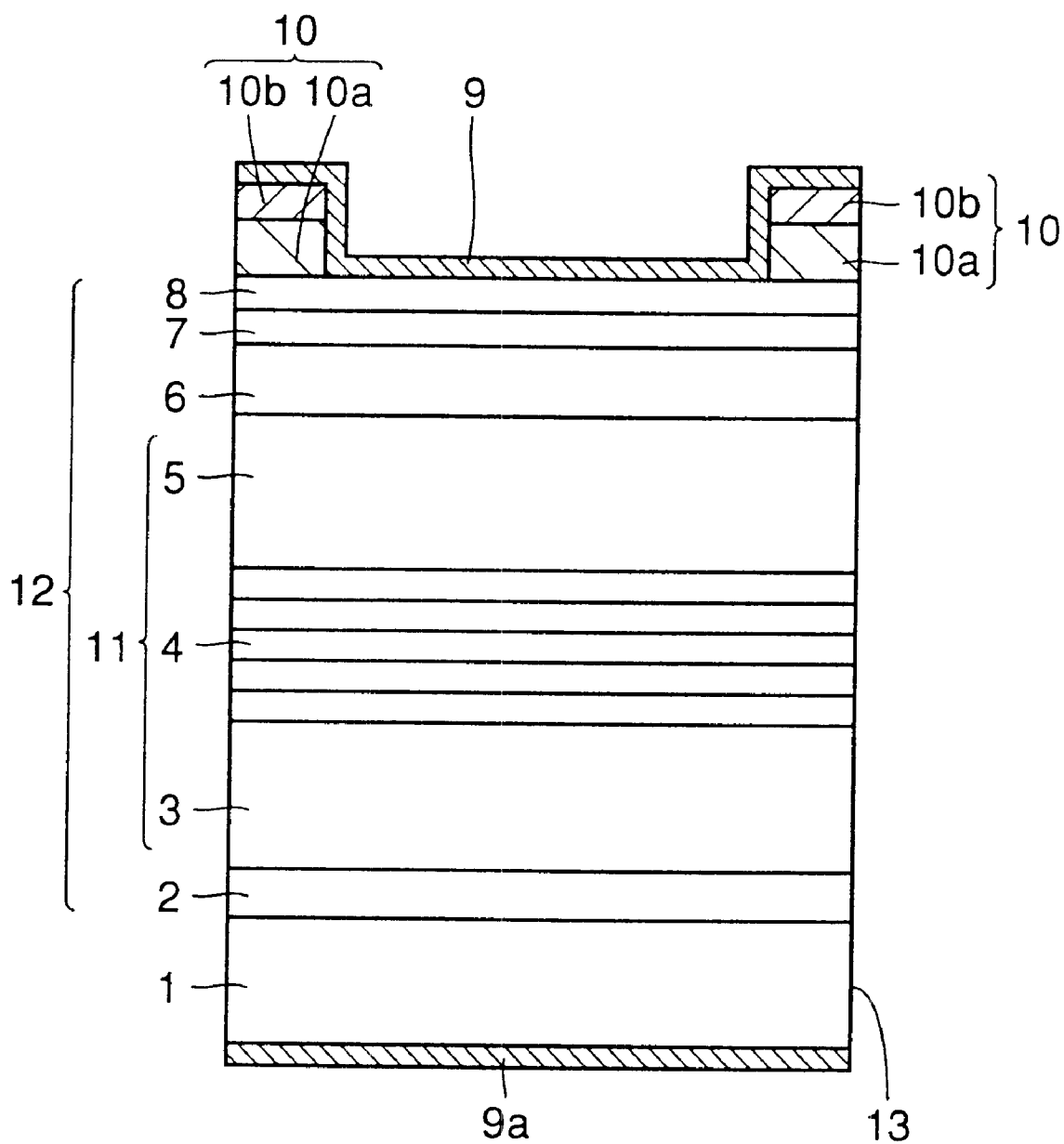

In the following, a second embodiment of the present invention will be described with reference to FIG. 2. FIG. 2 is a sectional view of an LED in the second embodiment of the present invention.

As shown in FIG. 2, base electrode 10 is placed on a region near cleavage plane 13 in the second embodiment. More specifically, base electrodes 10 are placed in a lattice manner on regions within about 50 μm from cleavage planes 13 (portions to be cleaved). Light transmitting Au electrode 9 is formed to extend from a region surrounded by base electrodes 10 to the tops of the base electrodes. Since other components are similar to the first embodiment, description thereof will not be repeated.

In the second embodiment, the doping concentration of p-type ZnTe layer 8 is also set at $1 \times 10^{19} cm^{-3}$ or less similarly to the first embodiment. Therefore, a Schottky barrier is formed between Ti layer 10a in base electrode 10 and p-type ZnTe layer 8, which prevents ohmic contact. It is therefore possible to suppress a current flow from base electrode 10 into light emitting structure 12. As a result, similarly to the first embodiment, it is possible to suppress a current flow into a region near cleavage plane 13 and to suppress an increase in defects in the region.

The LED in this embodiment may be provided by performing similar steps to the first embodiment till formation of p-type ZnTe layer 8 and, thereafter, forming base electrode 10 on the region near cleavage plane 13, and forming light transmitting Au electrode 9 such as by evaporation to cover base electrode 10. Then, the LED can be formed through similar steps to the first embodiment.

When the LED in this embodiment was measured in a constant current mode, high luminance green light emission was obtained of which light emission intensity was as high as 3 mW when a current of 20 mA was applied. Since the current rarely flowed near cleavage plane 13, the LED life was also improved.

Third Embodiment

Figure 3:
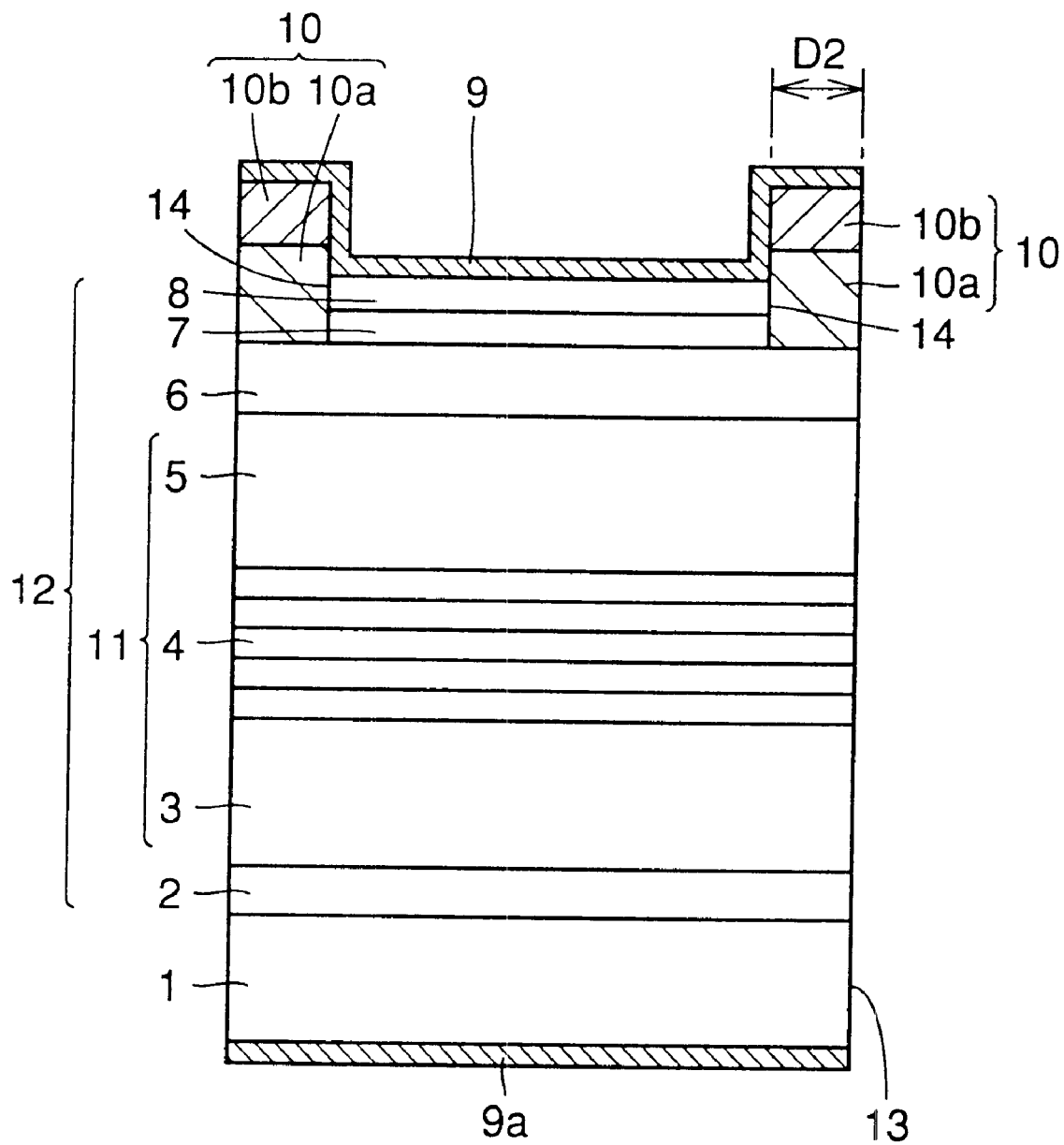

In the following, a third embodiment of the present invention will be described with reference to FIG. 3. FIG. 3 is a sectional view of an LED in the third embodiment of the present invention.

As shown in FIG. 3, in the third embodiment, an annular trench portion 14 extending to p-type ZnSe layer 6 and cleavage plane 13 is formed, and first base electrode 10 is formed inside trench portion 14. Width D2 from cleavage plane 13 to trench portion 14 is about 50 μm, for example. Since other components other than that are similar to the second embodiment, description thereof will not be repeated.

Since Ti layer 10a in base electrode 10 is in contact with p-type ZnSe layer 6 in this embodiment, ohmic contact is not attained and it is more difficult for a current to flow into a region under base electrode 10 than in the second embodiment. It is therefore possible to more effectively suppress a current flow into the region immediately under base electrode 10.

In the LED in this embodiment as well, high luminance green light emission was obtained similarly to each of the above described embodiments. Furthermore, the LED life can be improved.

Figure 15:
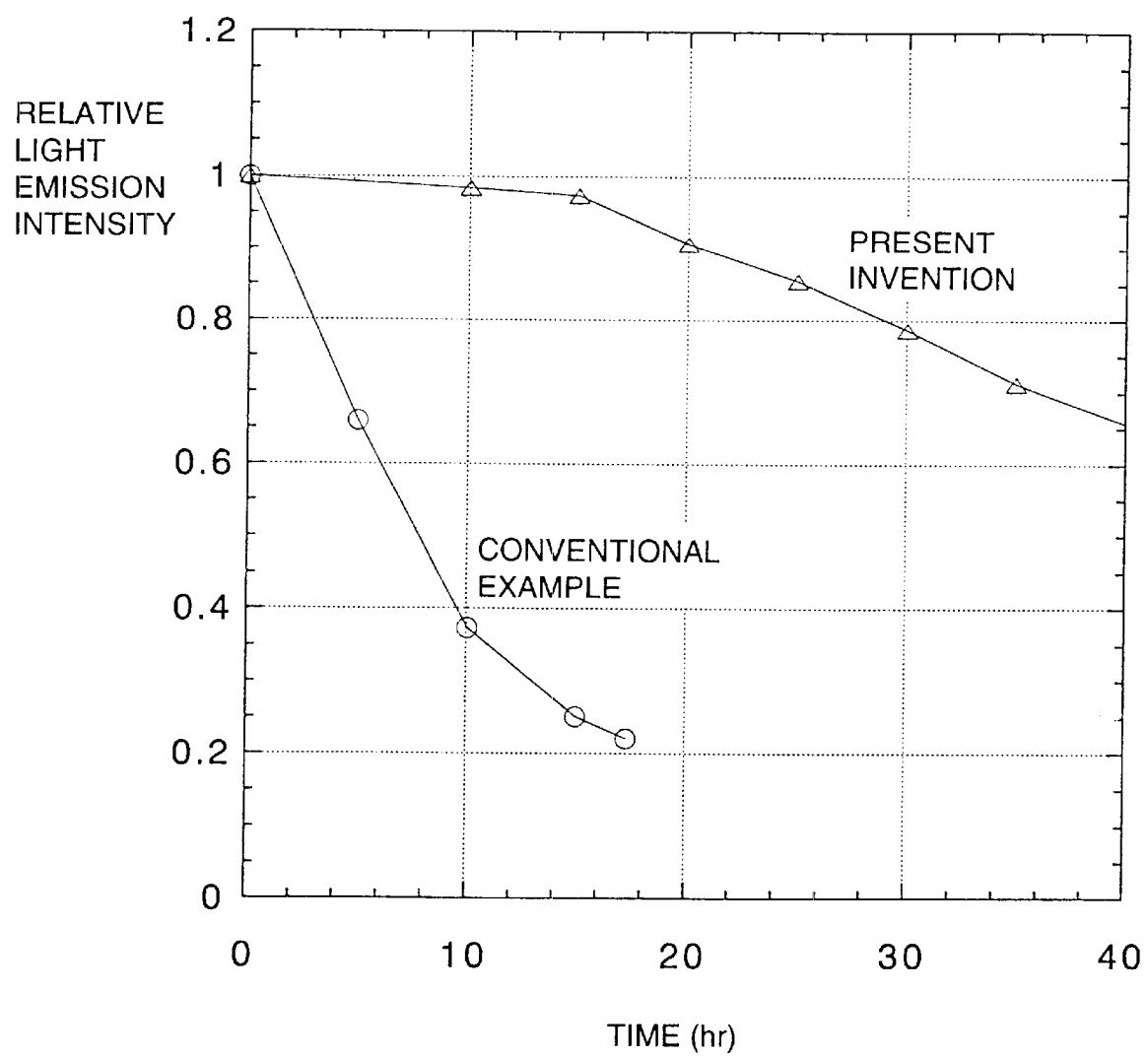
FIG. 15 illustrates current supply test results of the LED according to the present invention and a conventional LED.

FIG. 15 illustrates the current supply (injection) test results of the LED in this embodiment and a conventional LED. The employed conventional example was provided by forming a light transmitting Au electrode 9 on the entire surface and forming a pad for wire bonding on the chip center. The current supply conditions were room temperature and a direct current of 20 mA. The chip size was 500 μm for its sides.

It can be seen from FIG. 15 that the life of the LED according to the present invention is significantly improved as compared with the conventional example. It is considered that similar effects can also be attained by other embodiments.

In the following, an LED manufacturing method in a third embodiment will be described with reference to FIGS. 4 to 7.

Figure 4:
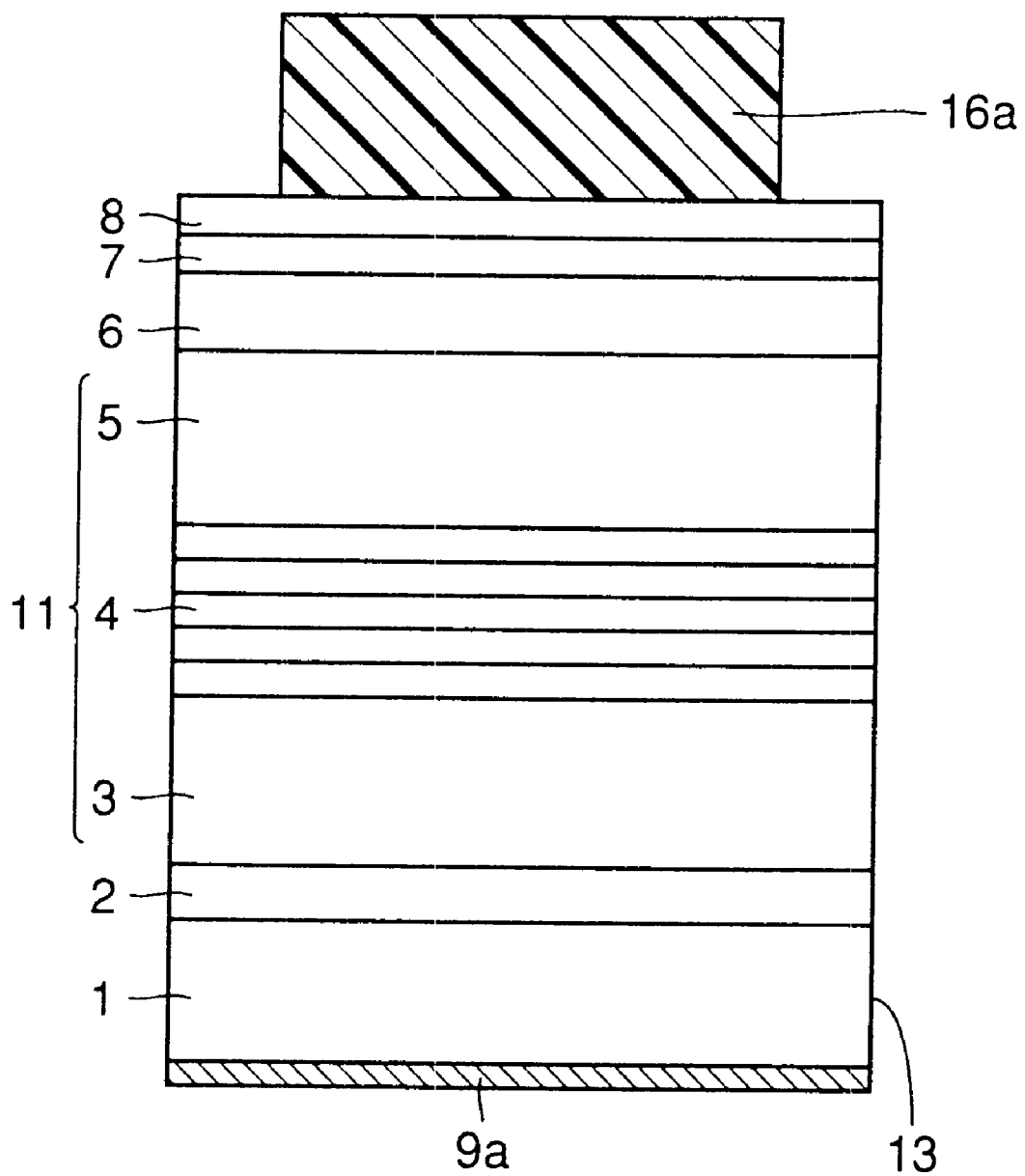
FIGS. 4 to 7 are sectional views showing first to fourth steps of a manufacturing process of the LED shown in FIG. 3.
Figure 5:
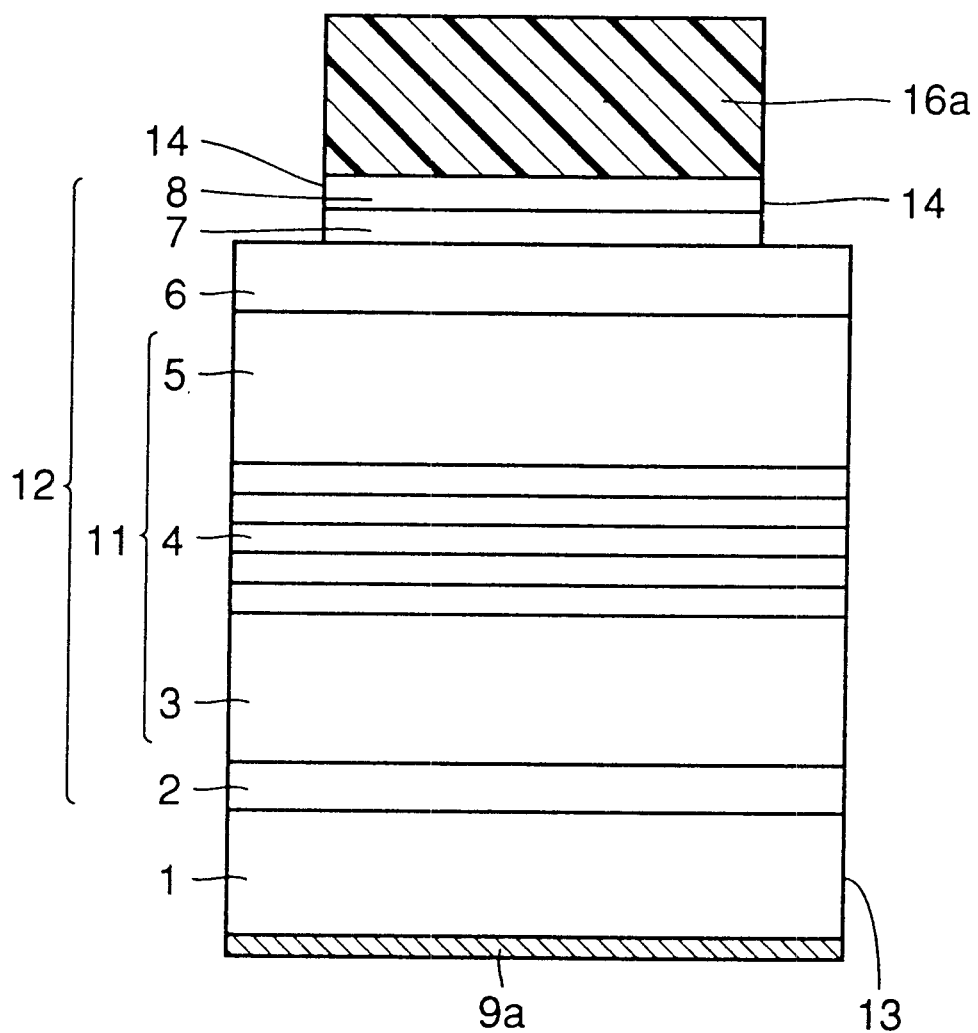

As shown in FIG. 4, similar steps to each of the above described embodiments are performed till formation of p-type ZnTe layer 8, and a resist 16a is applied thereon. After resist 16a is patterned to a prescribed shape, a trench portion 14 extending to p-type ZnSe layer 6 is formed by etching using resist 16a as a mask as shown in FIG. 5. In this case, wet etching may be employed although ion milling or reactive ion etching can improve the contact of an electrode and eliminate poor wire bonding.

Figure 6:
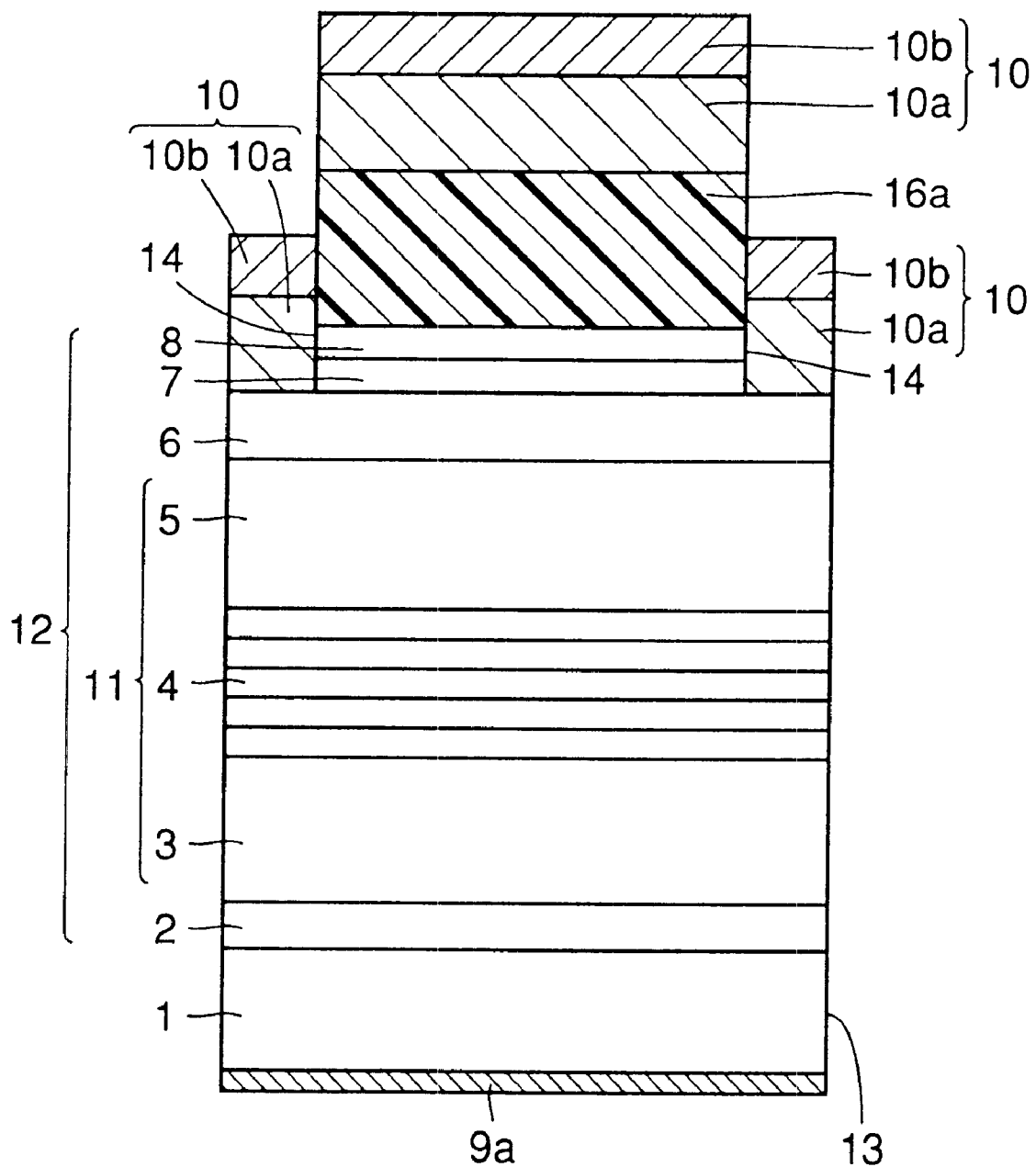
Figure 7:
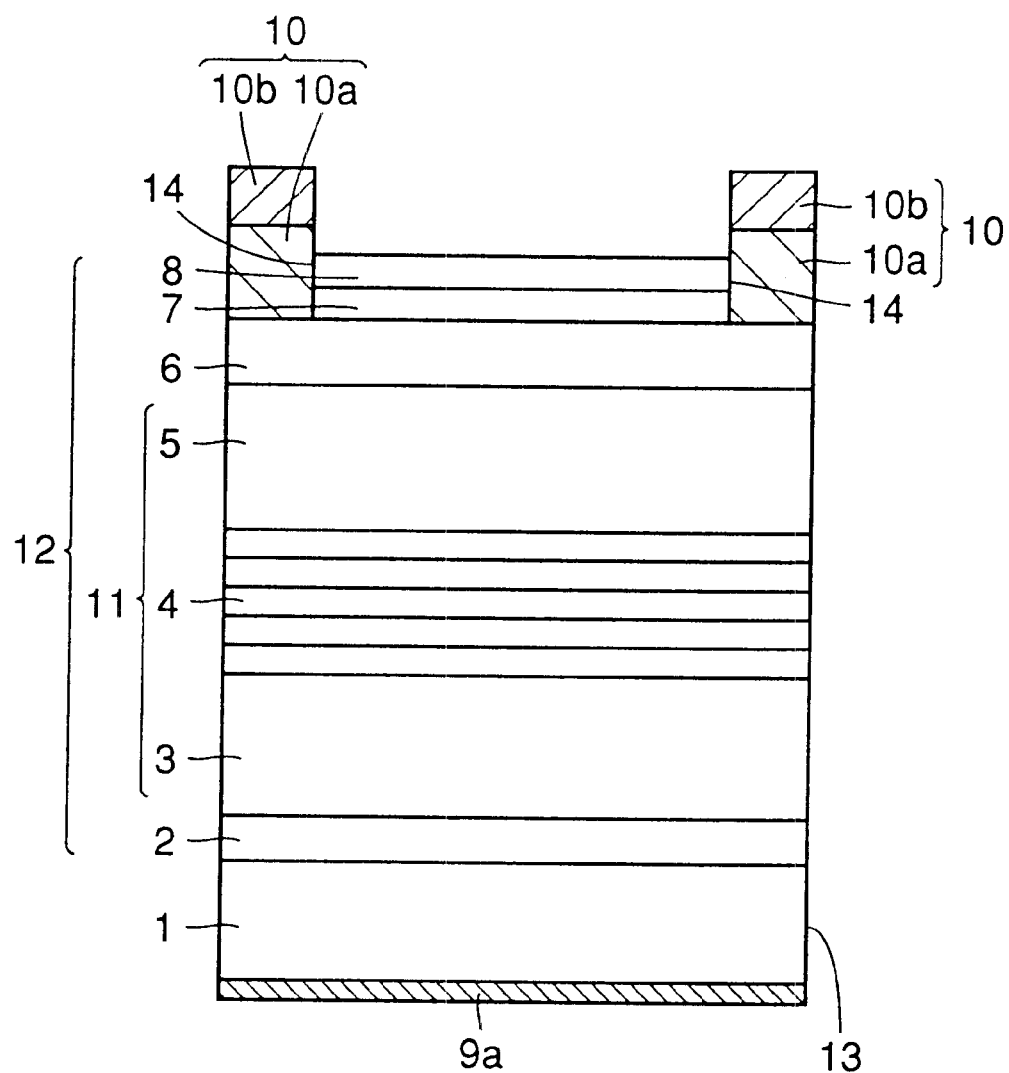

As shown in FIG. 6, Ti layer 10a and Au layer 10b are then deposited sequentially by evaporation. Thereafter, resist 16a is removed to expose the surface of p-type ZnTe layer 8 as shown in FIG. 7. Then, light transmitting electrode 9 is formed on the entire surface such as by evaporation. The above described steps result in the structure shown in FIG. 3. Thereafter, similar steps to the first and second embodiments are performed to form the LED.

Fourth Embodiment

Figure 8:
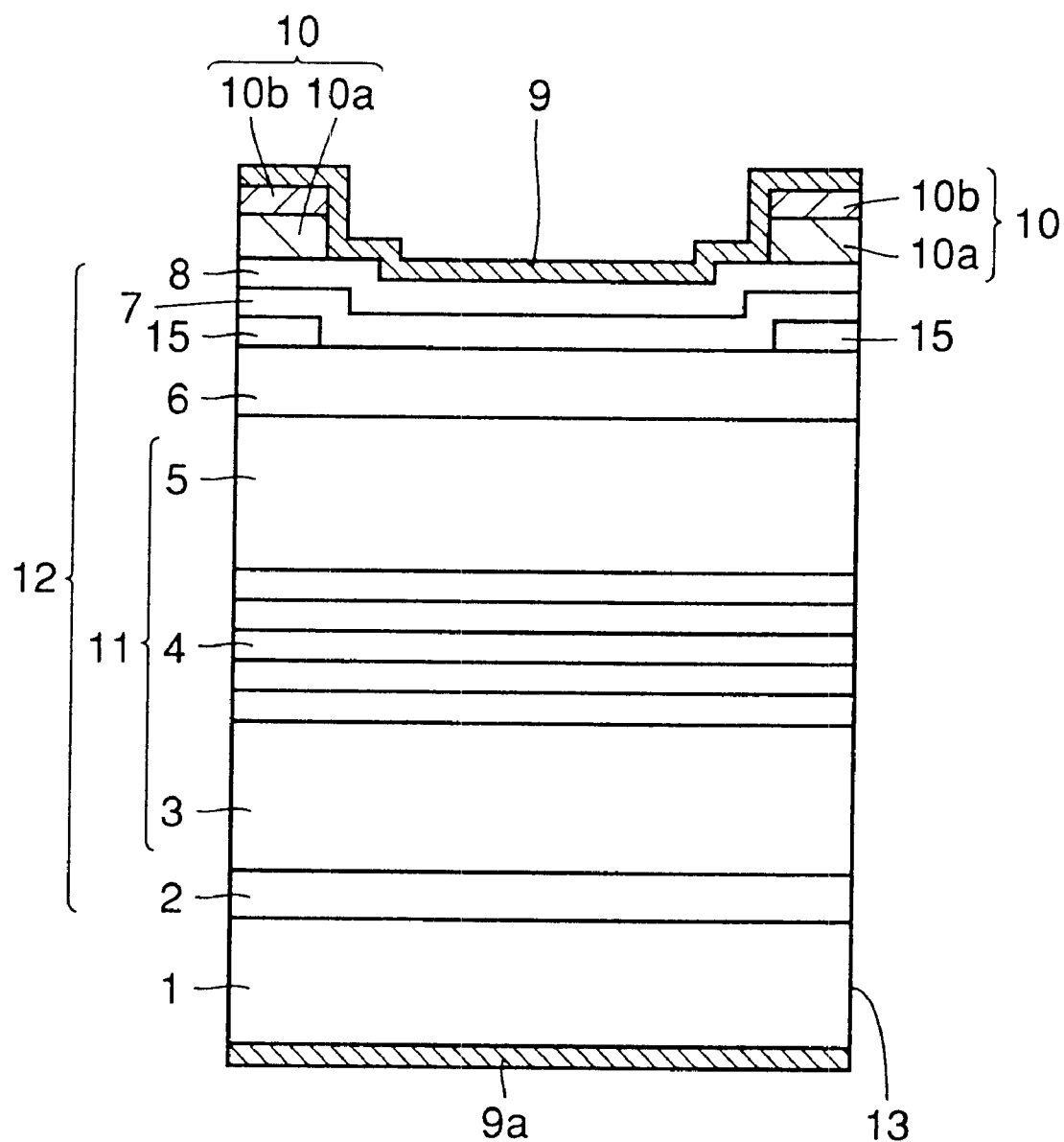
FIG. 8 is a sectional view of an LED in a fourth embodiment of the present invention.

In the following, a fourth embodiment of the present invention will be described with reference to FIGS. 8 to 14. FIG. 8 is a sectional view of an LED in the fourth embodiment of the present invention.

As shown in FIG. 8, a current suppression layer 15 is formed inside light emitting structure in this embodiment. Since other components are similar to the second embodiment, description thereof will not be repeated.

By thus providing current suppression layer 15 inside light emitting structure 12, a current flow into a region immediately under current suppression layer 15 can be suppressed. In other words, a current flow into a region near cleavage plane 13 can be suppressed.

For example, current suppression layer 15 may be an n-type semiconductor layer or any semiconductor layer which does not attain ohmic contact with Ti layer 10a in base electrode 10.

In the following, an LED manufacturing method in the fourth embodiment will be described with reference to FIGS. 9 to 14.

Figure 9:
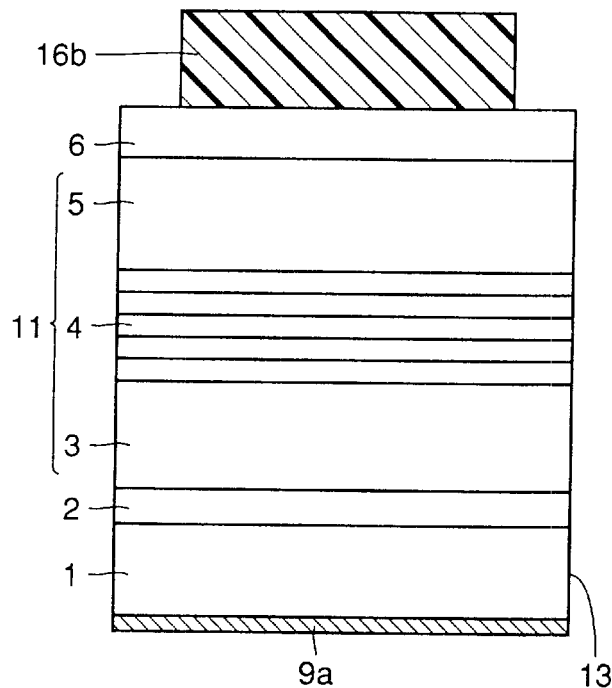
FIGS. 9 to 14 are sectional views showing first to sixth steps of a manufacturing process of the LED shown in FIG. 8.
Figure 10:
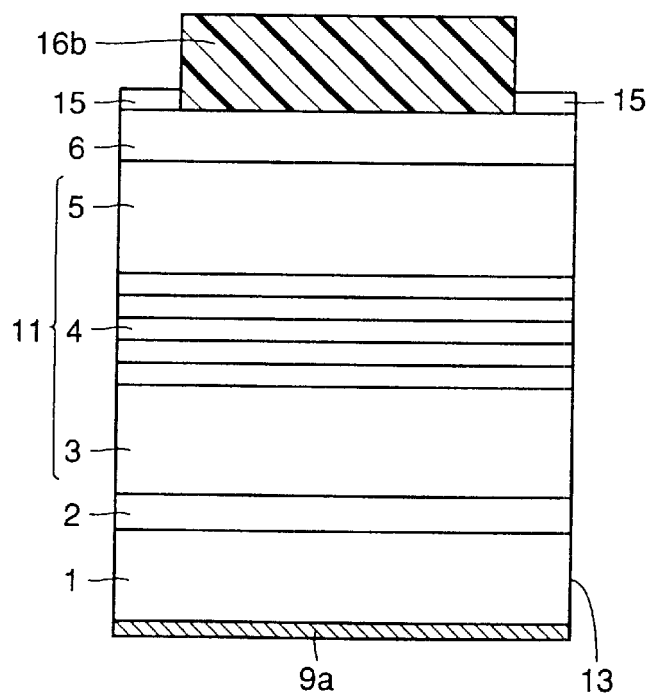

As shown in FIG. 9, similar steps to each of the embodiments will be performed till formation of p-type ZnSe layer 6, and a resist 16b is formed thereon. Thereafter, current suppression layer 15 is formed on p-type ZnSe layer 6 such as by epitaxial growth as shown in FIG. 10.

Figure 11:
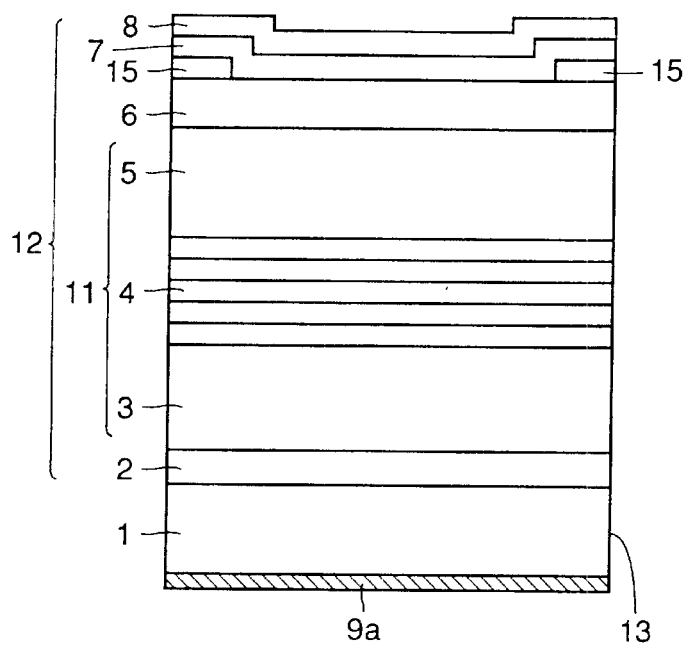

Resist 16b is then removed, and p-type contact layer 7 and p-type ZnTe layer 8 are formed to extend from the top of p-type ZnSe layer 6 to the top of current suppression layer 15 by epitaxial growth as shown in FIG. 11.

Figure 12:
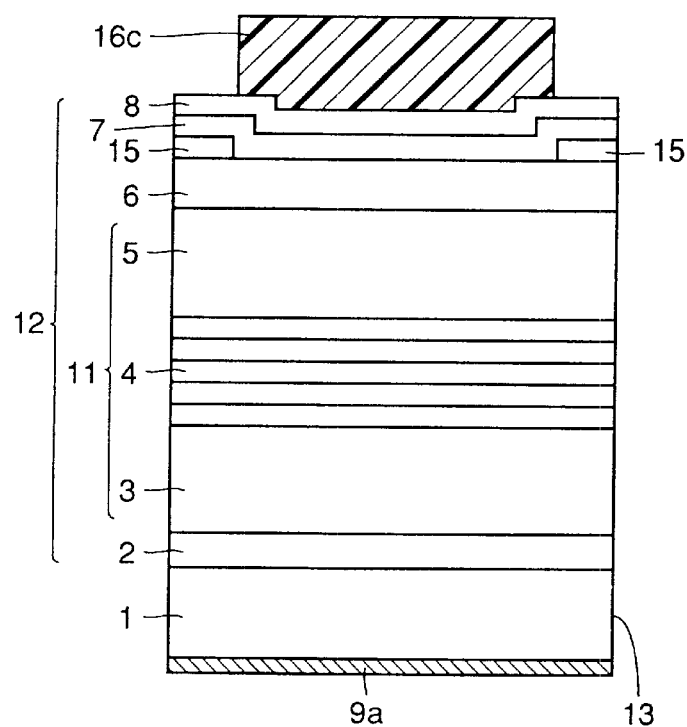
Figure 13:
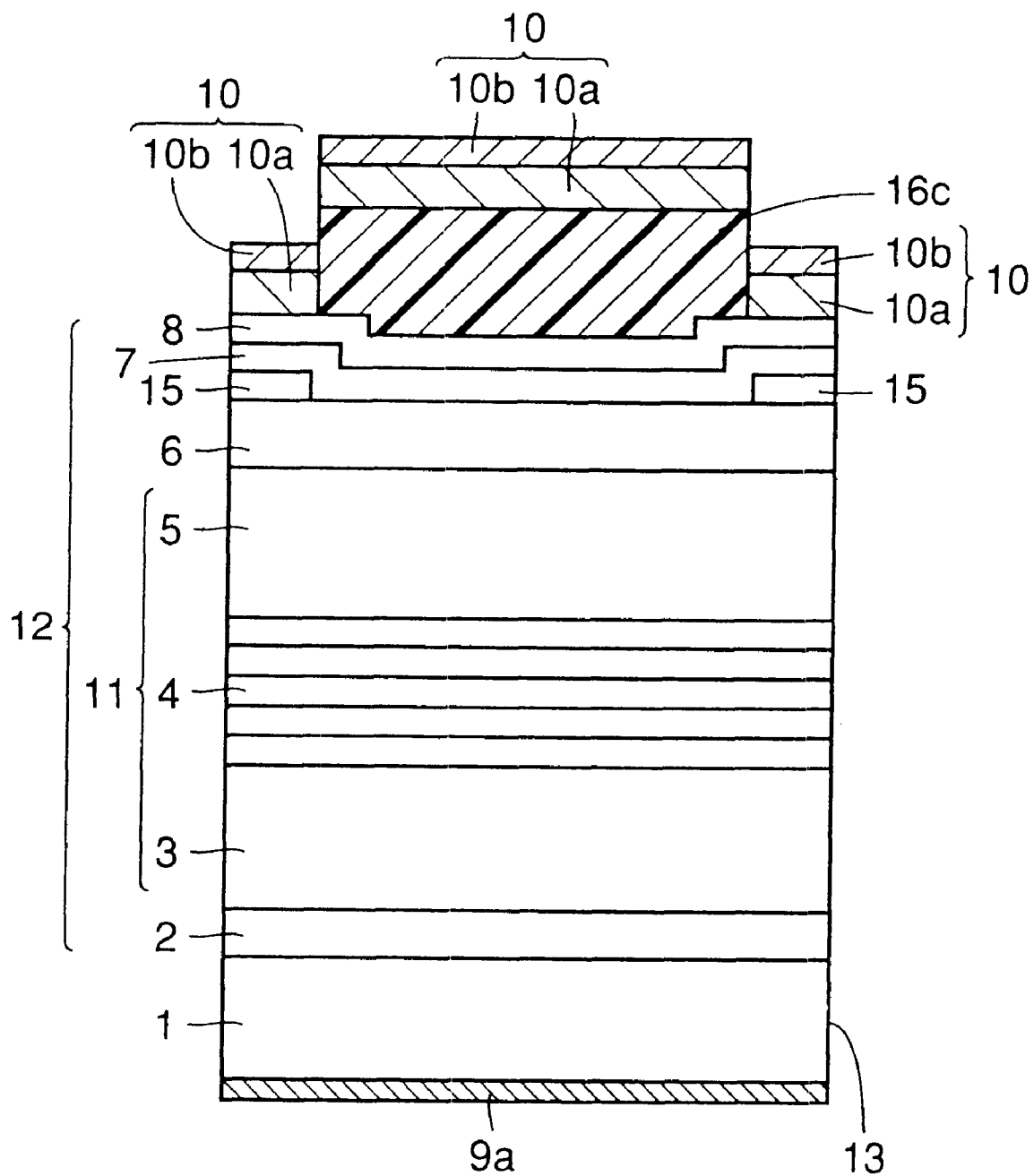
Figure 14:
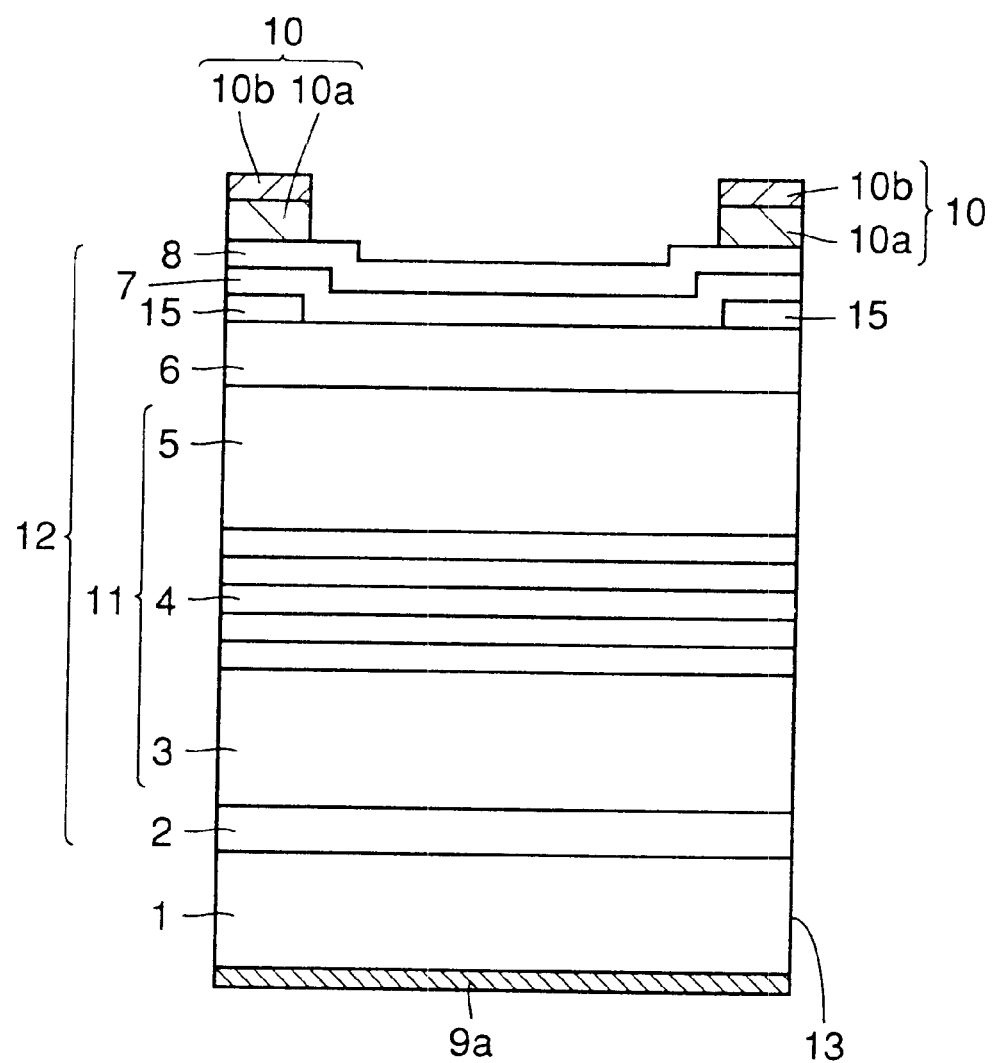

Then, a resist 16c is applied on p-type ZnTe layer 8 and patterned to a prescribed shape as shown in FIG. 12. Ti layer 10a and Au layer 10b are deposited such as by evaporation to obtain the structure shown in FIG. 13, and then resist 16c is removed.

Thereafter, light transmitting Au electrode 9 is formed on the entire surface such as by evaporation to obtain the structure shown in FIG. 8. Then, similar steps to the first embodiment are performed to form the LED.

In each of the above described embodiments, the description is based on a case where an injected current restriction region is formed in the region near cleavage plane 13. However, the injected current restriction region may be provided in other regions.

Furthermore, the light transmitting electrode may be formed of at least one material selected from the group consisting of Au, Pd, Ni and ITO (Indium Tin Oxide) or an alloy containing at least one material of the group.

In addition, the lower layer of base electrode 10 may be formed of at least one material selected from the group consisting of Ti, Al, ZnS, $Al_2O_3$, $SiO_2$ and SiN or an alloy containing at least one material of the group.

According to the present invention, the injected current restriction region is provided inside the LED and therefore a current for light emission can be prevented from flowing into a desired region in the LED. It is therefore possible to suppress an increase in defects in the region and to realize not only a longer life but also a higher luminance value for the LED. Especially by selecting a region having a large number of defects as the injected current restriction region, a much longer life and a much higher luminance value for the LED can be achieved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A light emitting diode comprising:
    a ZnSe substrate having a front surface and a back surface;
    a light emitting structure provided on said front surface of said ZnSe substrate;
    a first electrode provided for wire-bonding on said light emitting structure;
    a second electrode formed on said light emitting structure and covering said first electrode for diffusing an injected electric current into said light emitting structure; and
    a third electrode formed on said back surface of said ZnSe substrate;
    wherein said light emitting structure has a side face formed on a cleavage plane along which said light emitting structure has been cut; and
    wherein said second electrode has a peripheral edge that is separated from said cleavage plane by at least 5 $\mu$m.

2. The light emitting diode of claim 1, being a homoepitaxial ZnSe-based light emitting diode, wherein:
    said ZnSe substrate is a conductive ZnSe monocrystalline substrate; and
    said light emitting structure includes a mixed crystal compound semiconductor formed of ZnSe or mainly of ZnSe.

3. The light emitting diode of claim 1, wherein said second electrode is a translucent electrode and includes at least one type of material selected from the group consisting of Au, Pd, Ni and ITO (indium tin oxide).

4. The light emitting diode of claim 1, wherein said light emitting structure has therein, along said side face on said cleavage plane, an injected current restriction region from which an injected current diffused from said second electrode is restricted, due to said peripheral edge of said second electrode being separated from said cleavage plane by at least 5 $\mu$m.

5. A light emitting diode comprising:
- a ZnSe substrate having a front surface and a back surface;
- a light emitting structure provided on said front surface of said ZnSe substrate;
- a first electrode provided for wire-bonding on said light emitting structure;
- second electrode formed on said light emitting structure and covering said first electrode for diffusing an injected electric current into said light emitting structure; and
- a third electrode formed on said back surface of said ZnSe substrate;
- wherein said light emitting structure has a side face formed on a cleavage plane along which said light emitting structure has been cut; and
- wherein said first electrode is arranged on said light emitting structure on a first surface region adjacent to said cleavage plane and includes a portion formed of a first material not attaining ohmic contact with said light emitting structure, and said second electrode is formed of a second material providing ohmic contact with said light emitting structure.

6. The light emitting diode of claim 5, wherein said light emitting structure includes an internal semiconductor layer and an upper surface portion between said internal semiconductor layer and said second electrode, said light emitting structure has a trench provided at a peripheral portion around said upper surface portion of said light emitting structure and reaching said cleavage plane and said internal semiconductor layer, said first electrode is provided in said trench in physical contact with said internal semiconductor layer, and said internal semiconductor layer does not attain ohmic contact with said first electrode.

7. The light emitting diode of claim 6, wherein said trench has characteristics as formed by etching.

8. The light emitting diode of claim 7, wherein said trench has an irregular surface with an irregularity emphasized by said etching.

9. The light emitting diode of claim 8, wherein said characteristics are characteristics that result from said etching including ion milling and reactive ion etching.

10. The light emitting diode of claim 5, wherein said first surface region on which said first electrode is formed extends from said cleavage plane to at least 5 $\mu$m as measured from said cleavage plane, and said first material of said first electrode includes at least one type of material selected from the group consisting of Ti, Al, ZnS, $Al_2O_3$, $SiO_2$ and SiN.

11. The light emitting diode of claim 5, further comprising a current suppression layer arranged internally in said light emitting structure under said first electrode, wherein said current suppression layer suppresses electric current flow therethrough.

12. The light emitting diode of claim 5, wherein said light emitting structure has therein, along said side face on said cleavage plane, an injected current restriction region from which an injected current diffused from said second electrode is restricted, due to said first electrode including said portion formed of said first material not attaining ohmic contact with said light emitting structure.

13. A method of fabricating the light emitting diode according to claim 5, comprising the steps of:
- forming said light emitting structure on said front surface of said ZnSe substrate;
- forming, on said first surface region of said light emitting structure, said first electrode including at least said portion formed of said first material not attaining ohmic contact with said light emitting structure for restricting injected electric current under said first electrode;
- forming, on a second surface region of said light emitting structure, said second electrode formed of said second material providing ohmic contact with said light emitting structure for diffusing injected electric current under said second electrode; and
- forming said third electrode on said back surface of said ZnSe substrate.

14. A method of fabricating the light emitting diode according to claim 11, comprising the steps of:
- forming said light emitting structure on said ZnSe substrate by successively stacking on said ZnSe substrate a first semiconductor layer including a light emitting layer, a second semiconductor layer forming said current suppression layer selectively provided on said first semiconductor layer, and a third semiconductor layer extending over said first and second semiconductor layers continuously;
- forming, on said first surface region of said light emitting structure located on said second semiconductor layer, said first electrode including at least said portion formed of said first material not attaining ohmic contact with said second semiconductor layer for suppressing injected electric current under said first electrode; and
- forming, on a second surface region of said light emitting structure free of said second semiconductor layer, said second electrode formed of said second material providing ohmic contact with said light emitting structure for diffusing injected electric current under said second electrode; and
- forming a third electrode on a back surface of said ZnSe substrate.

* * * * *

UNITED STATES PATENT AND TRADEMARK OFFICE
CERTIFICATE OF CORRECTION

PATENT NO.   : 6,420,731 B1  
DATED        : July 16, 2002  
INVENTOR(S)  : Katayama et al.

It is certified that error appears in the above-identified patent and that said Letters Patent is hereby corrected as shown below:

Title page,
Item [56], OTHER PUBLICATIONS, following "ZnCdSe/", insert -- ZnSSe/ --.

Item [57], ABSTRACT,
Lines 1 to 6, replace to read as follows:
-- A ZnSe-based LED has therein an injected current restriction region in which an injected current for light emission is reduced or restricted, whereby a current-induced increase of defects in this region is suppressed and light emission efficiency is increased. In one embodiment, an edge of a light transmitting Au electrode is separated from a side cleavage plane of the LED, so that a region between the edge of the electrode and the cleavage plane serves as the injected current restriction region. --.

Column 2,
Line 12, after "Preferably,", replace "th e" by -- the --.

Column 3,
Line 44, after "of", insert -- : --.

Column 5,
Line 21, after "light", insert -- emitting structure. First base electorde 10 has a Ti layer --.

Column 9,
Line 8, before "second", insert -- a --.

Signed and Sealed this

Fifth Day of November, 2002

Attest:

JAMES E. ROGAN  
*Attesting Officer*   *Director of the United States Patent and Trademark Office*